United States Patent

Alexeyev et al.

(10) Patent No.: US 9,537,492 B2
(45) Date of Patent: Jan. 3, 2017

(54) SAMPLED ANALOG LOOP FILTER FOR PHASE LOCKED LOOPS

(71) Applicant: ANALOG DEVICES, INC., Norwood, MA (US)

(72) Inventors: Alexander A. Alexeyev, Beverly, MA (US); Eric G. Nestler, Cambridge, MA (US)

(73) Assignee: ANALOG DEVICES, INC., Norwood, MA (US)

( * ) Notice: Subject to any disclaimer, the term of this patent is extended or adjusted under 35 U.S.C. 154(b) by 0 days.

(21) Appl. No.: 14/745,017

(22) Filed: Jun. 19, 2015

(65) Prior Publication Data

US 2015/0372682 A1 Dec. 24, 2015

Related U.S. Application Data

(60) Provisional application No. 62/015,002, filed on Jun. 20, 2014.

(51) Int. Cl.
*H03L 7/06* (2006.01)
*H03L 7/085* (2006.01)

(52) U.S. Cl.
CPC .................................. *H03L 7/085* (2013.01)

(58) Field of Classification Search
USPC ................... 327/147–149, 156–158
See application file for complete search history.

(56) References Cited

U.S. PATENT DOCUMENTS

| 5,537,448 | A | | 7/1996 | Schwarz et al. |
| 5,552,942 | A | * | 9/1996 | Ziperovich ...... G11B 20/10009 360/51 |
| 6,078,614 | A | | 6/2000 | Brown et al. |
| 6,226,322 | B1 | * | 5/2001 | Mukherjee ............ H04B 3/145 333/28 R |

(Continued)

FOREIGN PATENT DOCUMENTS

| EP | 899883 | 3/1999 |
| GB | 2505254 | 2/2014 |

(Continued)

OTHER PUBLICATIONS

PCT Patent Application Serial No. PCT/US2015/036843 filed Jun. 20, 2015.

(Continued)

*Primary Examiner* — Adam Houston
(74) *Attorney, Agent, or Firm* — Patent Capital Group

(57) ABSTRACT

An integrated circuit implements at least part of a phase locked loop (PLL). The integrated circuit includes a sampled analog loop filter for the PLL. The loop filter includes a first input for receiving a signal representative of a phase difference between a reference clock signal and a first clock signal, a first output for providing a frequency control signal for controlling a frequency of an oscillator, a clock input for accepting a loop timing clock signal for controlling timing of operation of the loop filter, and a digital control input for configuring a response of the loop filter according to a plurality of control values. In some examples, the loop filter includes charge storage elements coupled by controllable switches, and control circuitry for transferring charge among the charge storage elements to yield the configured response of the loop filter.

27 Claims, 12 Drawing Sheets

(56) References Cited

U.S. PATENT DOCUMENTS

| | | | |
|---|---|---|---|
| 2004/0196085 A1* | 10/2004 | Shen | H03H 15/00 327/277 |
| 2006/0119444 A1 | 6/2006 | Horan | |
| 2009/0322418 A1* | 12/2009 | Burke | H03H 15/023 327/552 |
| 2012/0218053 A1* | 8/2012 | Cook | H03H 15/023 333/166 |
| 2013/0023946 A1* | 1/2013 | Valvano | A61B 5/0538 607/18 |
| 2013/0182792 A1* | 7/2013 | Wyville | H04B 1/0475 375/296 |
| 2013/0214830 A1* | 8/2013 | Jackson | H03C 3/08 327/156 |
| 2013/0229734 A1* | 9/2013 | Beck | H02H 3/162 361/42 |
| 2015/0137785 A1* | 5/2015 | Stevens | H02M 3/157 323/283 |
| 2015/0256273 A1* | 9/2015 | Sun | H04B 17/13 375/224 |
| 2015/0372682 A1* | 12/2015 | Alexeyev | H03L 7/085 327/156 |

FOREIGN PATENT DOCUMENTS

| | | |
|---|---|---|
| WO | 2009/083498 | 7/2009 |
| WO | 2010/132714 | 11/2010 |

OTHER PUBLICATIONS

International Search Report and Written Opinion for PCT Patent Application Serial No. PCT/US2015/036843 mailed Oct. 22, 2015, 8 pages.

* cited by examiner

SAMPLED ANALOG LOOP FILTER FOR PHASE LOCKED LOOPS

PRIORITY DATA

This application is a non-provisional of U.S. Provisional Patent Application Ser. No. 62/015,002, filed Jun. 20, 2014, which is hereby incorporated by reference in its entirety.

BACKGROUND

This invention relates to phase locked loop (PLL) circuits and more specifically to using a configurable time-sampled analog-value phase loop filter for the PLL.

A phase locked loop (PLL) is a circuit that generates an output signal whose phase is related to a phase of an input reference signal. In general, the circuit makes use of a feedback loop in which a signal representing a phase of the output signal is fed back and compared to the phase of the input reference signal. A circuit generates a signal representing a difference between the phases, and this signal drives a controlled oscillator that generates the output signal, thereby closing the feedback loop.

Referring to FIG. 1, an example of a PLL includes a phase comparator 110, which accepts a reference signal 105 and a feedback signal 145 and produces a phase difference signal 115. The phase difference signal is passed to a loop filter 120, which produces a control signal 125, which is passed to a controlled oscillator 130. The output 135 of the controlled oscillator 130 is passed back as the feedback signal 145 to the phase comparator 110, optionally first passing through a frequency divider 140, such that a division by a factor N results in the output signal having a frequency N times the frequency of the reference signal. In general, the loop filter 120 is used to adjust characteristics of the feedback loop, for instance, to control stability, response time, and/or steady-state error.

Referring to FIG. 2, in a more specific example of a Type II PLL circuit, a phase comparator 210 includes a phase frequency detector (PFD) 211 followed by a charge pump 214. The PFD 211 has two outputs, UP 212 and DOWN 213, whose timing is shown in FIG. 3. When the rising edge of the reference signal 105 leads the rising edge of the feedback signal 145, the UP pulse occurs for a greater duration than the DOWN pulse by the difference in the times of the rising edges, and when the rising edge of the feedback signal 145 leads the rising edge of the reference signal, the DOWN pulse occurs for a greater duration than the UP pulse, again by the difference in the times of the rising edges. The charge pump 214 produces a constant positive current during UP pulses and a constant negative current (of the same magnitude) during DOWN pulses. This results in an average current that is directly proportional to the phase error between the inputs to the PFD. The current output signal 215 of the charge pump is passed to a discrete component analog filter 220, for example, composed of a resistor and capacitor network, producing a voltage signal that is passed to a voltage controlled oscillator (VCO) 230. Characteristics of the PLL may be configured, in some cases be dynamically, according to one or more of the charge pump current level, the VCO gain, selection of analog component values in the filter, and the division factor of the feedback divider (if used).

Many PLLs have used external loop filters for high performance applications. PLL's having external loop filters can have a very low loop bandwidth, resulting in low phase noise specifications. A low loop bandwidth mitigates the phase noise profile caused by filter, charge pump, and PFD closer to the VCO output frequency. For VCOs running at GHz frequencies and VCO gain of 10's of MHz/V, charge pump currents in the 0.1 to 10 mA range this means values of capacitors for simple 2nd order filter for the PLL loop bandwidth of 10 KHz may require a range of 1 to 100 nF and zero setting resistor of 100 ohms. Integrating such large capacitor values on the die with PLL core is not feasible. Using external filters is thus accepted as a given and custom system design is generally required for most new variants of a system.

Another issue is that fractional signal multiplication and frequency synthesis (i.e., feedback division by a non-integer value of N) can suffer from spurious tones in the spectrum of the VCO output signal. This pathology can be mitigated by using higher order loop filters. This technique is complicated by the need for more sophisticated stability analysis of the loop then is usually required for the 2nd or 3rd order filter, constricting loop filter parameter choices and adding to the filter induced noise and the board area occupied by the filter. Consequently, integrating loop filter in the PLL core is considered to be even harder than in the case of integer clock multipliers and synthesizers.

Highly integrated systems on a chip (SOC) that boast both fully integrated clock generating PLLs and sometimes RF synthesizers, integrating PLL loop filter on silicon die have been available. Difficulties in design of such systems include forming large loop filter capacitors with low leakage current. Other approaches for integrating loop filters include digitizing the output of a phase detector and using a digital loop filter in what is referred to as an all-digital PLL, however use of digital filters can add complexity and introduce quantization noise induced error at the output of the phase detector.

SUMMARY

In one aspect, in general, an integrated circuit implements at least part of a phase locked loop (PLL). The integrated circuit includes a configurable (e.g., digitally programmable) sampled analog loop filter for the PLL, the loop filter including a first input for receiving the signal representative of a phase difference between a reference clock signal and a first clock signal, a first output for providing a frequency control signal for controlling a frequency of an oscillator; a clock input for accepting a loop timing clock signal for controlling timing of operation of the loop filter, and a digital control input for configuring a response of the loop filter according to a plurality of control values. In some implementations, the sampled analog loop filter is a time-sampled analog phase loop filter.

In some examples, the loop filter comprises charge storage elements coupled by controllable switches. The loop filter comprises control circuitry for transferring charge among the charge storage elements according to sequential configurations of the controllable switches, the sequential configurations being determined by the control values to yield the configured response of the loop filter. In some examples, a signal path between the first input and the first output of the loop filter comprises at most one active gain element.

In some examples, the integrated circuit includes one or more of (a) an input for receiving a reference clock signal, and comparison circuitry including a first input for receiving the reference clock signal and a second input for receiving a first clock signal and an output for providing a signal representative of phase difference between the reference clock signal and the measured clock signal, (b) a clock divider including an input for receiving a second clock signal and an output for providing the first clock signal formed such that the second clock signal has a frequency that is a configure multiple of the first clock signal, and (c) a controlled oscillator having an input for receiving the frequency control signal from the loop filter and an output for providing a generated clock signal.

In another aspect, in general, an integrated circuit implements at least part of a phase locked loop (PLL). The integrated circuit includes a configurable sampled analog loop filter for the PLL, the sampled analog loop filter including a first input for receiving the signal representative of a phase difference between a reference clock signal and a first clock signal, a first output for providing a frequency control signal for controlling a frequency of an oscillator; a clock input for accepting a loop timing clock signal for controlling timing of operation of the sampled analog loop filter, and a digital control input for configuring a response of the sampled analog loop filter according to a plurality of control values. The sampled analog loop filter comprises a plurality of charge storage elements coupled by controllable switches, wherein the sampled analog loop filter comprises control circuitry for transferring charge among the charge storage elements according to sequential configurations of the controllable switches, the sequential configurations being determined by the plurality of control values to yield a configured response of the sampled analog loop filter.

In another aspect, in general, a method includes, receiving, by a configurable sampled analog loop filter which is at least part of the an integrated circuit of a phase locked loop (PLL), a phase difference signal representative of a phase difference between a reference clock signal and a feedback clock signal in the PLL. The sampled analog loop filter also receives a digital control input for configuring a response of the sampled analog loop filter according to a plurality of control values. The sampled analog loop filter comprises a plurality of charge storage elements coupled by controllable switches. The sampled analog loop filter comprises control circuitry for transferring charge among the charge storage elements according to sequential configurations of the controllable switches, the sequential configurations of the controllable switches being determined by the plurality of control values to yield a configured response of the sampled analog loop filter. The sampled analog loop filter also receives a loop timing clock signal for controlling timing of operation of the sampled analog loop filter, and provides a frequency control signal for controlling a frequency of an oscillator using the received phase difference signal, the digital control input and the loop timing clock signal.

According to another aspect, an integrated circuit implementing at least part of a phase locked loop (PLL) includes a plurality of sampled analog filters for the PLL. Each sampled analog filter includes a first input for receiving a signal representative of a phase difference between a reference clock signal and a first clock signal, a first output for providing a frequency control signal for controlling a frequency of an oscillator, and a clock input for accepting a loop timing clock signal for controlling timing of operation of the sampled analog filter. Each of the plurality of sampled analog filters are positioned in parallel in an input path for the first input. The plurality of sampled analog filters comprise a plurality of charge storage elements coupled by controllable switches, wherein the plurality of sampled analog filters comprises control circuitry for transferring charge among the charge storage elements to yield a configured response of the plurality of sampled analog filters.

In some implementations, each of the plurality of sampled analog filters are fixed-coefficient time-sampled analog filters. In some implementations, the plurality of sampled analog filters includes a first filter having a small loop bandwidth and a second filter having a large loop bandwidth.

According to various implementations, each sampled analog filter further includes a digital control input, and the digital control input configures a response of the respective sampled analog filter according to a plurality of control values. In some implementations, the integrated circuit includes a digital control input for selecting one of the plurality of sampled analog filters for providing the first output to the oscillator. In one implementation, the digital control input switches between ones of the plurality of sampled analog filters.

Aspects may have one or more of the following advantages.

Integration of the loop filter with other components of a PLL in an integrated circuit can reduce the number of parts in a complete implementation of the PLL. In particular, use of external analog components (e.g., capacitors, resistors) implementing a continuous time filter can be avoided.

Sampling of the phase difference signal at the charge pump output provides electrical isolation between charge pump output and VCO control voltage input, unlike in the conventional discrete component RC filter. This helps to reduce effects of non-ideal charge pump operation, such as UP and DOWN current pulse mismatch and timing skews, that result in performance degradation manifested in larger phase noise and reference spurs Configuration of the loop filter with multiple control values permits run-time selection of configurations in a manner that would be difficult with a discrete component implementation of an analog filter. For example, a wide range of configurations can be selected, which can be useful in software-defined radio applications.

Improved spur mitigation can be achieved in fractional N clock synthesis, for example, by synchronous operation of the loop filter and the reference clock, or by use of higher order or time varying filtering approaches. Operating Sampled Analog Loop Filter at sampling frequencies that are several multiples of the reference clock frequency also pushes spurs up in frequency where they can be better attenuated by the appropriate for the chosen loop bandwidth and Loop Filter sampling frequency reconstruction RC filter.

Adaptive PLL bandwidth control is simplified using digital control of the loop filter characteristics.

SA (Sampled Analog) technology uses Discrete Time Filter Architecture with all the advantages that it brings in terms of programmability combined with analog signal processing which eliminates any data path quantization noise issues and analog to digital and digital to analog conversion steps. This makes it particularly attractive for discrete PLL loop filter replacement where both input and output signals are analog in nature.

Very low corner frequencies for a filter can be achieved by the difference between smaller caps that can be integrated on a chip. By keeping the Nyquist rate of the filter high the quantization noise in-band is reduced. A reconstruction filter may still be needed but this can be implemented with a higher corner frequency and then also smaller component values Other features and advantages of the invention are apparent from the following description, and from the claims.

DESCRIPTION OF DRAWINGS

To provide a more complete understanding of the present disclosure and features and advantages thereof, reference is made to the following description, taken in conjunction with the accompanying figures, wherein like reference numerals represent like parts, in which.

DESCRIPTION

Systems and methods are described herein for providing a sampled analog loop filter for a Phase-Locked Loop. As described herein, using a sampled analog loop filter for a PLL allows for an internal loop filter, which can be integrated with a PLL.

A number of embodiments are described below in the general context of Type II Phase-Locked Loops (PLLs) but without loss of generality can be extended to Type I PLLs as well. A primary difference between these types of PLLs is the nature of the relationship between a phase detector output and a VCO control port input. In Type I PLLs the output of the phase detector is physically a voltage and the loop filter performs as voltage in—voltage out low pass filter, while in Type II PLLs a Charge Pump is added to drive the loop filter. This has two important implications. First, the output of the charge pump is current (rather than voltage) which results in loop filter that also acts as a transresistance element that converts that current into the VCO control voltage while performing required filtering. Second, addition of charge pump introduces an additional pole at zero frequency requiring different loop filter properties from the ones required for Type I architecture. The techniques described below can also be successfully applied to other phase and frequency control architectures that utilize a feedback loop to adjust phase and/or frequency of the generator output signal with respect to the phase and/or frequency of an input reference signal. Phase Locked Loops are one example of such a system. Other examples of such systems are Automatic Frequency Controlled circuits (AFC), Frequency Tracking circuits, Phase and Frequency Demodulators, and Clocks and Data Recovery (CDR) circuits.

Figure 4A:
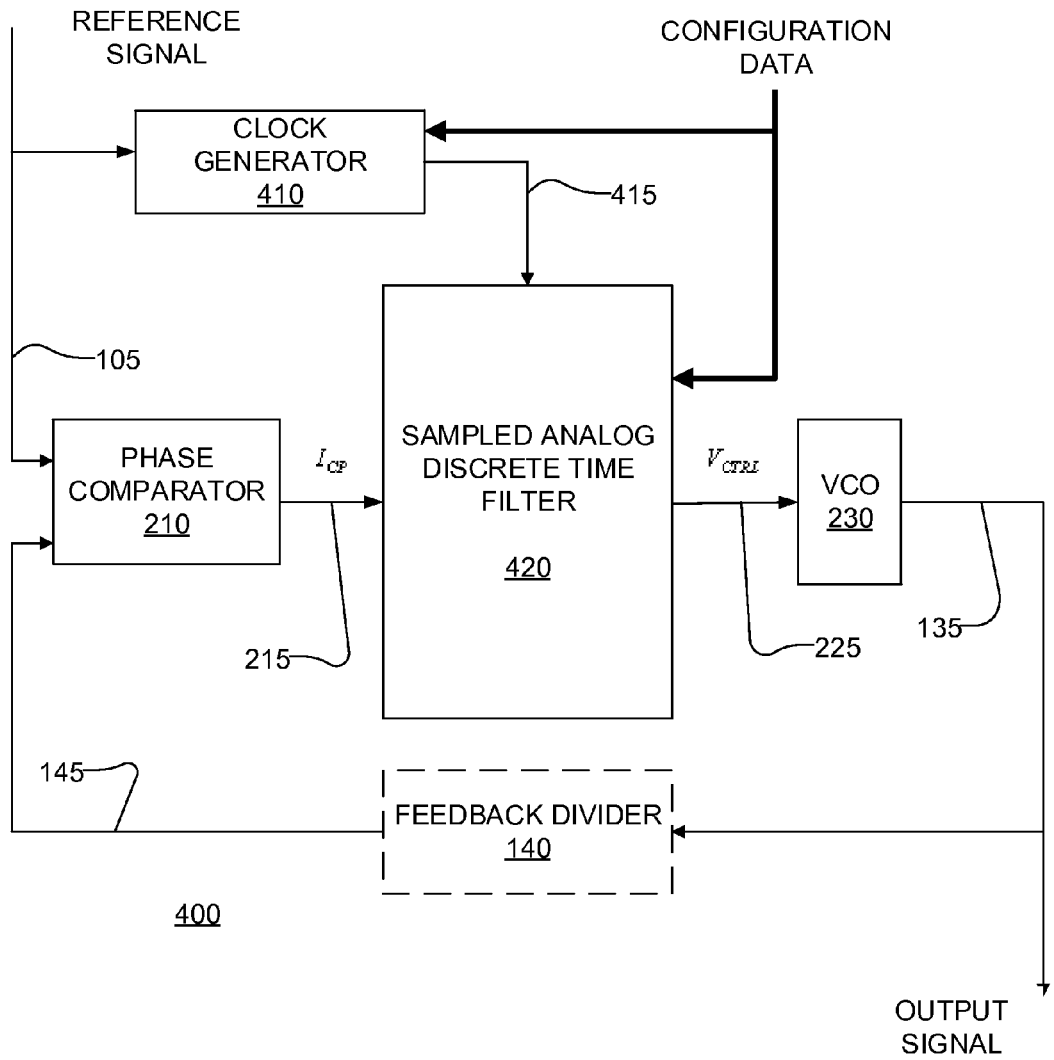
FIG. 4A is a block diagram of a phase locked loop with a sampled analog (SA) loop filter, according to some embodiments of the disclosure.

Referring to FIG. 4A, a set of implementations of a phase locked loop (PLL) 400 makes use of a sampled analog (SA) loop filter 420. A phase comparator 210 receives a reference signal 105, and a feedback signal 145, and produces a pulsed current signal, $I_{CP}$ on an output 215. The pulsed current signal is received by the sampled analog filter 420, which produces a voltage output signal, $V_{CTRL}$, which controls a voltage controlled oscillator 230. The characteristics of the sampled analog filter 420 are determined by configuration data, for example, provided over a digital control bus (e.g., SPI) and stored in registers, and the sampled analog filter is clocked by an output of a clock generator 410 such that its operation is synchronized with the reference signal 105.

Figure 1:
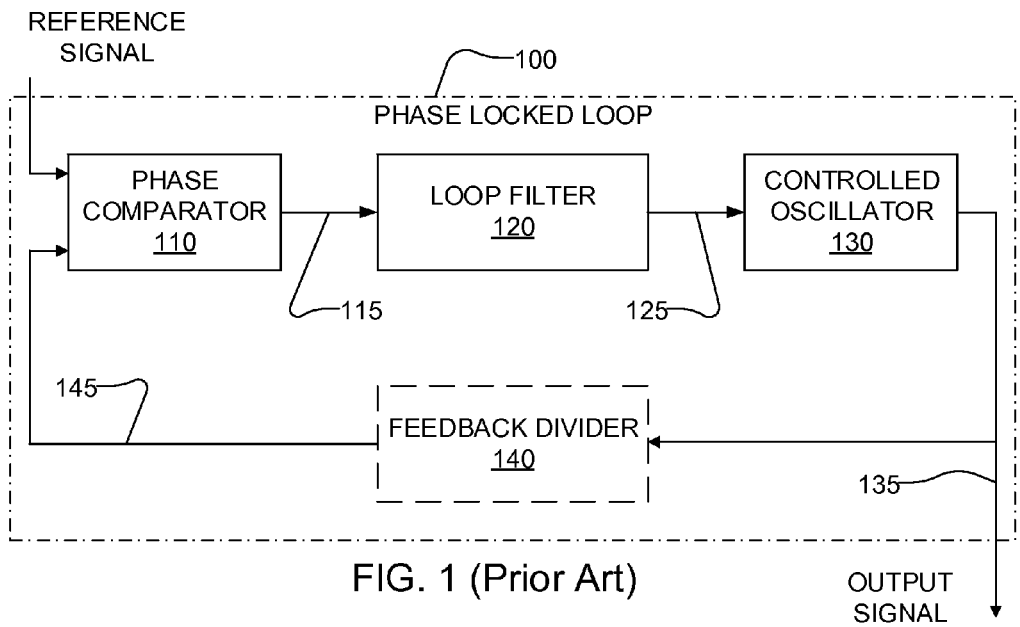
FIG. 1 is a block diagram of a phase locked loop.
Figure 2:
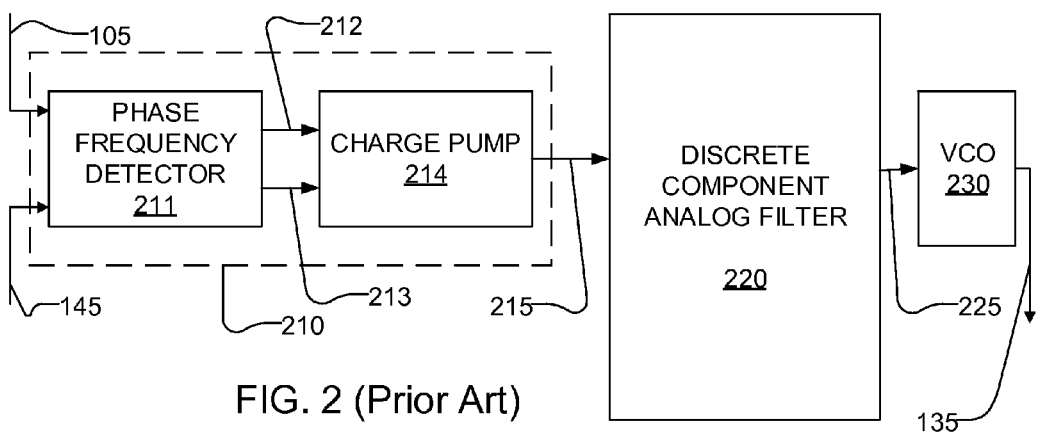
FIG. 2 is a block diagram of part of a Type II phase locked loop using a phase frequency detector and analog filter.
Figure 14:
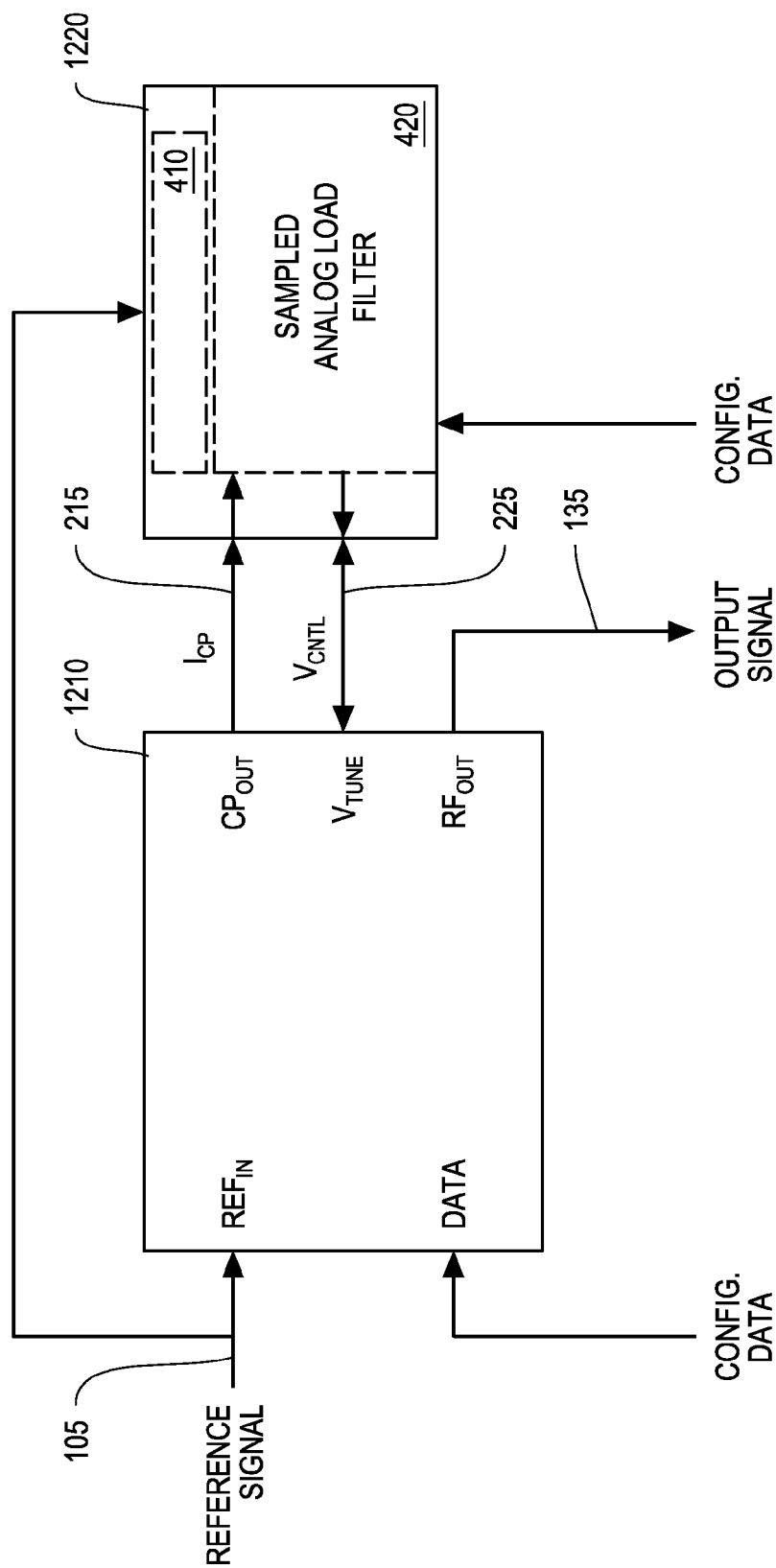
FIG. 14 is a circuit diagram of a sampled analog loop filter coupled to a conventional wideband synthesized with integrated VCO part, according to some embodiments of the disclosure.

Various implementations of the type shown in FIG. 4A integrate different components on one or more integrated circuits, which may be produced as separate parts or optionally integrated into multiple chip modules (MCM). In some implementations, the sampled analog filter 420 suitable for being driven by the output of the phase comparator 210, optionally along with the clock generator 410, is integrated on a separate part from the other components. For example, as shown in FIG. 14, the other components are provided in an Analog Devices Inc., ADF4350 "Wideband Synthesizer with Integrated VCO." 1210, which is coupled to a second part 1220, which includes the clock generator 410 and the sampled analog filter 420, with each of the two parts being configurable with digital control values. In other implementations, the phase comparator 210 and frequency divider 140 are in one part, the sampled analog filter 420 and clock generator 410 are in another part, and the VCO 230 is in a third part. In other embodiments, the sampled analog filter 420 and clock generator 410 are integrated into the same part as the phase comparator. Yet other implementations may combine different components of FIG. 4A into one or more separate parts without deviating from the approaches described in detail below. In FIG. 4A, the phase comparator 210 and VCO 230 are illustrated as those used in prior PLLs (see, e.g., FIG. 2). In at least some implementations, alternative configurations that are well-matched to a sampled analog loop filter may be used.

According to some implementations, the SA filter 420 is a programmable sampled analog discrete time filter. In a programmable SA discrete time filter, the filter coefficients can be changed to adjust filter settings such as loop bandwidth.

Figure 4B:
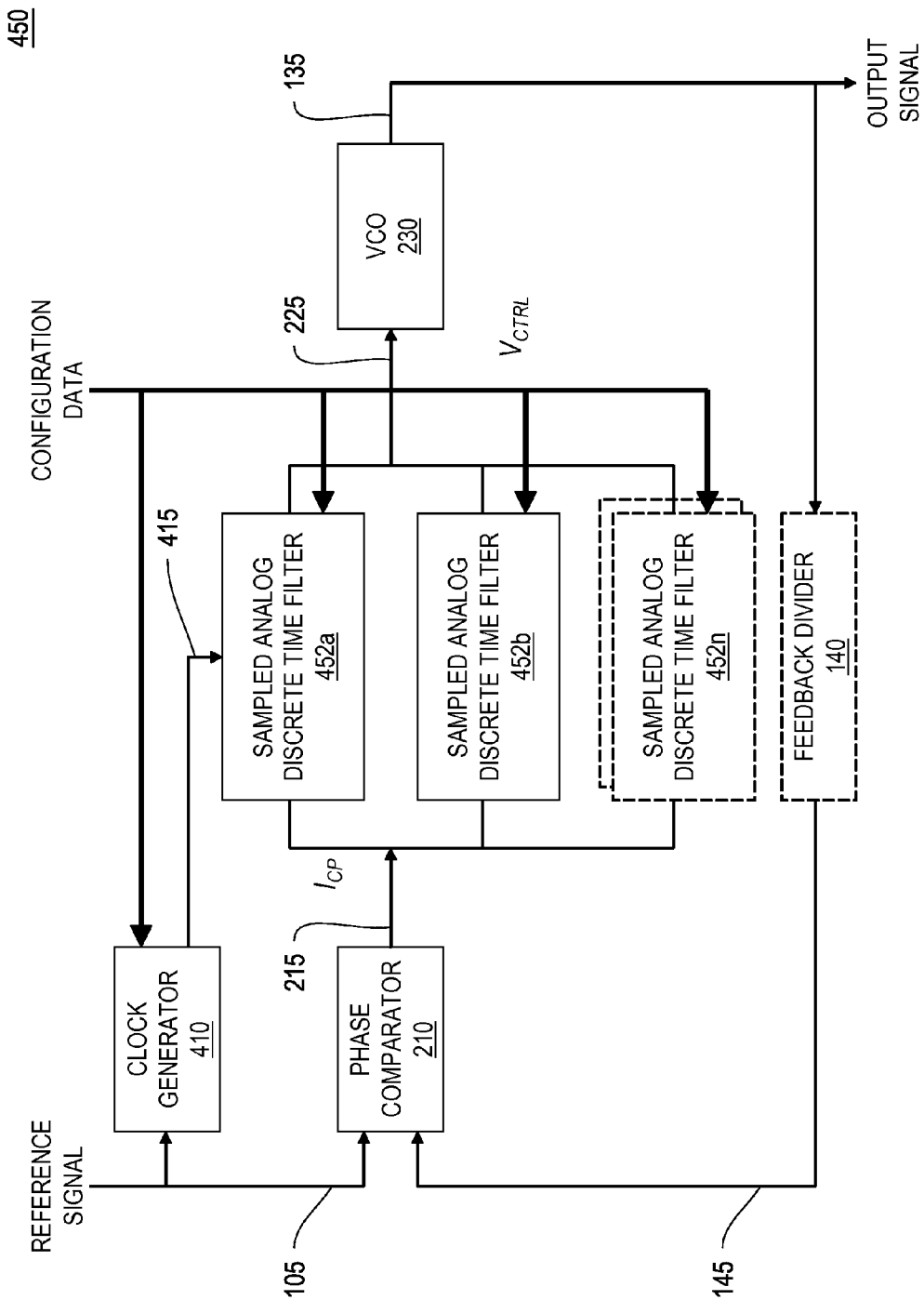
FIG. 4B is a block diagram of a phase locked loop with multiple sampled analog (SA) loop filters, according to some embodiments of the disclosure.

FIG. 4B is a block diagram of a phase locked loop with multiple sampled analog (SA) loop filters. In particular, FIG. 4B shows an example of a phase locked loop (PLL) 450 including multiple parallel SA loop filters 452a, 452b, and 452n. The SA loop filters 452a, 452b, and 452n are fixed coefficient SA discrete time filters. The filter 452n is optional, and various implementations do not include the filter 452n. In one example, the PLL 450 includes two SA loop filters 452a and 452b. In other implementations, the PLL 450 includes three or more than three SA loop filters 452a, 452b, and 452n.

According to one implementation, the configuration data is used to switch among the SA filters 452a, 452b, and 452n. In some examples, the SA filters 452a, 452b, and 452n have fixed characteristics, and the configuration data switches between the filters based on a mode of operation to optimize performance. In some examples, a system having a bank of fixed characteristic filters 452a, 452b, and 452n is smaller, more power efficient, and performs better, than a system having one or more fully configurable, programmable filters.

Figure 12:
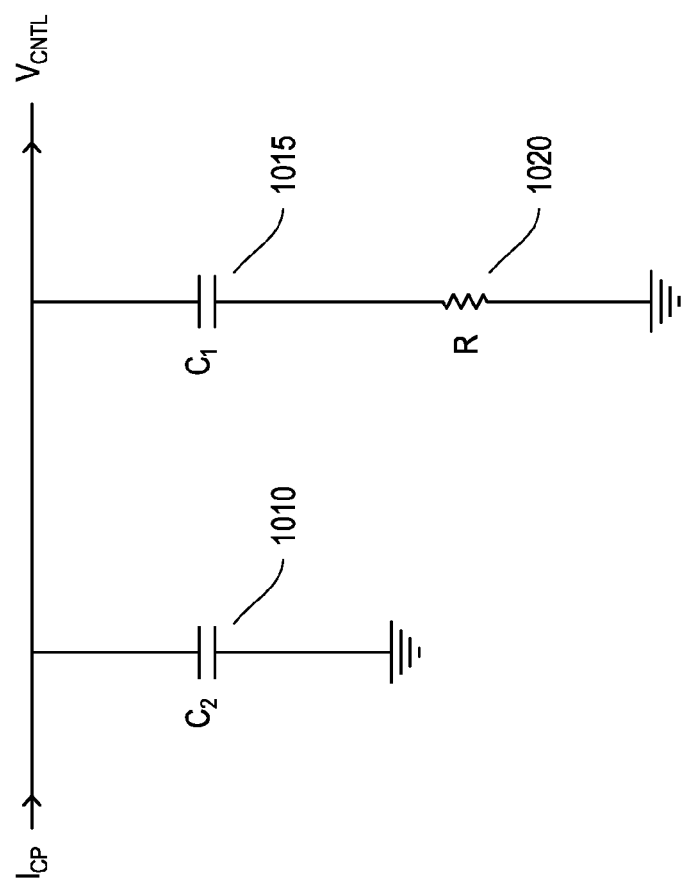
FIG. 12 is a circuit diagram for a discrete component analog loop filter, according to some embodiments of the disclosure.

According to some implementations, the description of FIG. 12 below describes transfer functions F(S) of a continuous time filter and an equivalent discrete time SA version H(z) of the time filter. The transfer function H(z) nominator and denominator has coefficients $b_0$, $b_1$ and $a_0$, $a_1$ that determine overall loop bandwidth of the PLL. According to some implementations, the coefficients are selected to achieve the balance between low phase noise and quick lock time, which have contradictory requirements. For a PLL with low phase noise of the PLL, a small loop bandwidths are used. In various examples, a small loop bandwidth is between about 2 kHz and 4 MHz. In some examples, for a frequency synthesizer for wireless communications, a small loop bandwidth is about 10 kHz. In contrast, for a PLL with a quick lock time, a large loop bandwidth is used. In some examples for a Fast Locking PLL, a large loop bandwidth is at least about 1MHz. In one implementation, a balance the between the low phase noise and quick lock time is achieved with a coefficient ratio close to 10.

In one implementation, two SA filters 452a, 452b arranged in parallel and enabled at different times of PLL operation allows for a simple switch between a low phase noise filter setting and a quick lock time filter setting. In one example, a first SA filter 452a has the fixed set of coefficients implemented by capacitor ratios described herein, and has a transfer function corresponding to the small loop bandwidth. A second SA filter 452b has a different fixed set of coefficients implemented using different capacitor ratios, and has a transfer function corresponding to the large loop bandwidth. Thus, using the two parallel fixed-coefficient SA filters allows the PLL to have both quick lock time and low phase noise. In a further implementation, a third SA filter 452n is added in parallel with the first 452a and second 452b SA filters. In other implementations, four or more SA filters can be included in the PLL.

Figure 5:
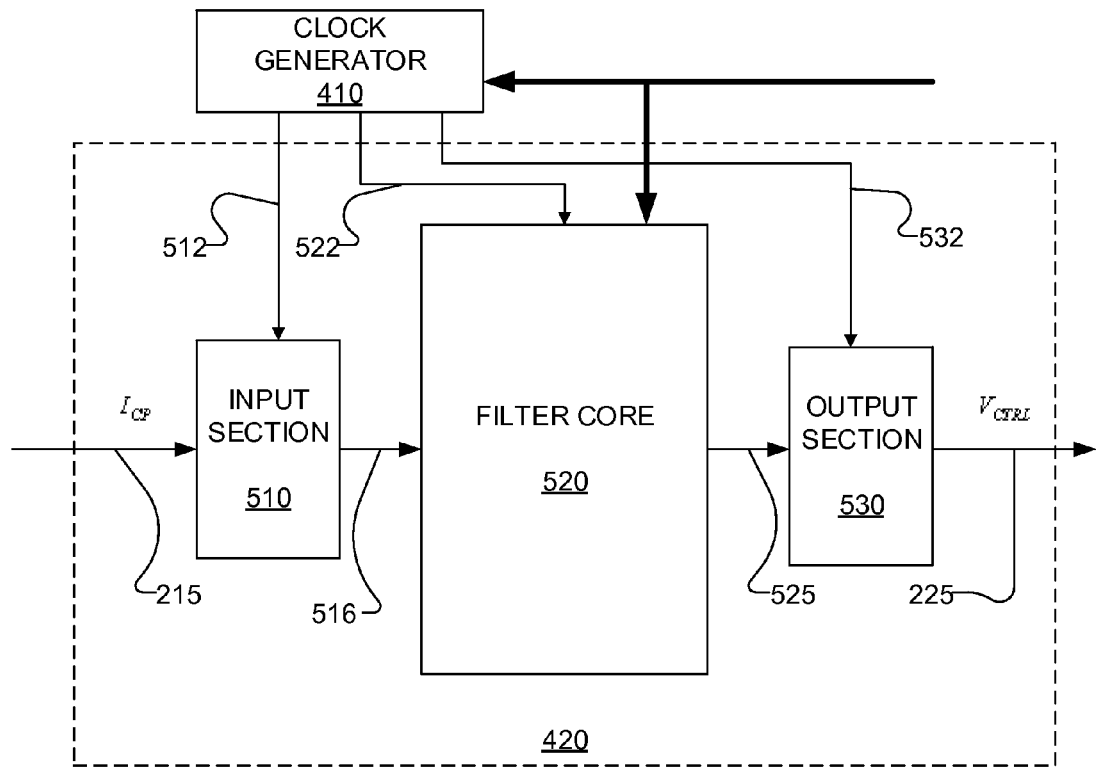
FIG. 5 is a block diagram of a sampled analog loop filter, according to some embodiments of the disclosure.
Figure 6:
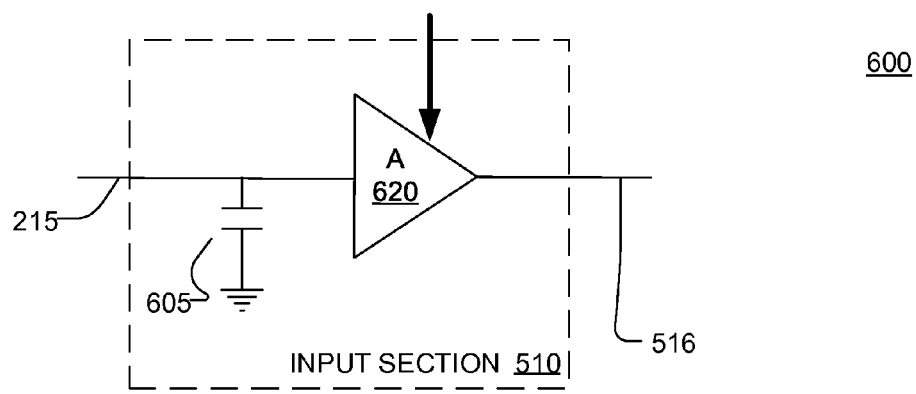
FIG. 6 is a circuit diagram of a first example of an input section to a sampled analog loop filter, according to some embodiments of the disclosure.
Figure 7:
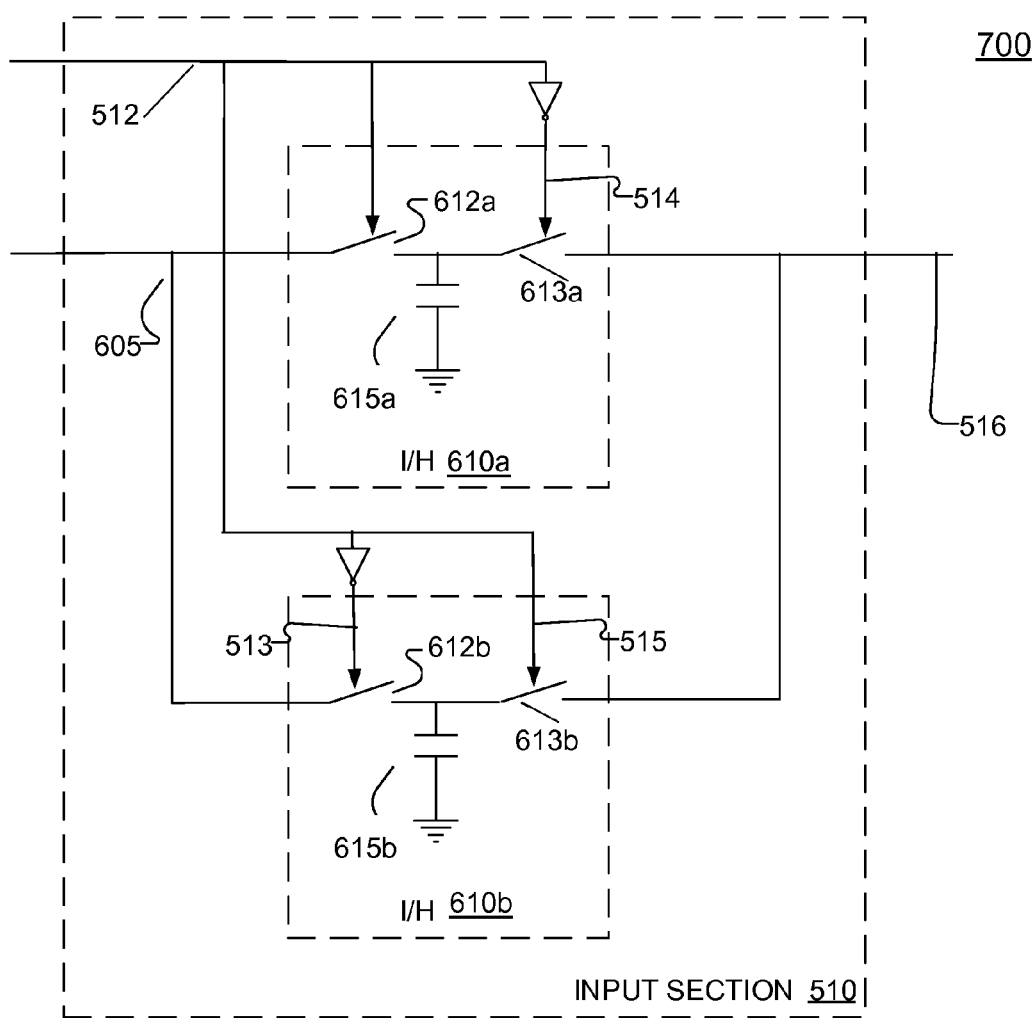
FIG. 7 is a circuit diagram of a second example of an input section to a sampled analog loop filter, according to some embodiments of the disclosure.

FIG. 5 shows an example of a sampled analog loop filter 420. The loop filter includes an input section 510, a filter core 520, and an output section 530. The input section 510 accepts the charge pump current, $I_{CP}$. The output section 530 provides the output control signal, $V_{CTRL}$, for driving the VCO 230. Various alternative designs of the filter core 520 may be used, and some examples designs are discussed in detail herein. FIGS. 6 and 7 illustrate two examples of input sections 510.

FIG. 6 is a circuit diagram of an example of an input section 600 to a sampled analog loop filter. The input section 600 includes a capacitor 605, and an amplifier 620. The capacitor 605 has a capacitance $C_1$, which is directly charged and discharged according to the charge pump current. The voltage on the capacitor represents integrated charge pump current.

$$V_{TH}(t) = \int_0^t I_{CP}(\tau)d\tau$$

The voltage across the capacitor 605 is buffered with unity-gain buffer amplifier 620, and can be used as an input signal 515 for the Filter Core of FIG. 5.

Figure 8:
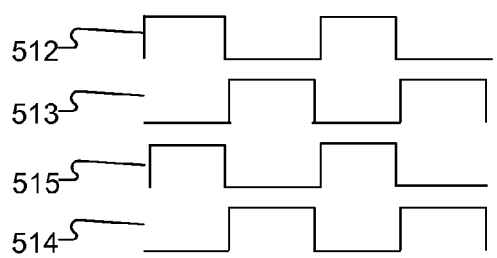
FIG. 8 is a timing diagram of control signals for the circuit shown in FIG. 7, according to some embodiments of the disclosure.

FIG. 7 is a circuit diagram of a second example of an input section 700 to a sampled analog loop filter. The input section 700 includes two integrate-and-hold circuits 610a, 610b. The integrate-and-hold circuits 610a, 610b are enabled on alternate-non-overlapping phases (513, 514, 515 shown in FIG. 8) of the control signal 512. Thus, the integrate-and-hold circuits 610a, 610b perform essentially the same function as a capacitor. As shown in FIG. 7, each integrate-and-hold circuit 610a, 610b includes a capacitor 615a, 615b. The capacitors 615a, 610b are used to integrate charge pump current and provide input to the SA filter. As described below, the capacitors 615a, 615b operate in a ping-pong fashion, in which one capacitor 615a, 615b is used to integrate the charge pump current while the other capacitor 615a, 615b is used to charge-share with the filter core 520. The control signal 512 controls which capacitor 615a, 615b is used for to integrate the charge pump and which capacitor 615a, 615b is used to charge share with the filter fore 520, and the capacitors 615a, 615b switch functions depending on the phase, as described below.

The integrate-and-hold circuits 610a, 610b operate in two phases and include switches 612a, 612b, and 613a, 613b, respectively. Additionally, each integrate-and-hold circuit 610a, 610b includes an integrating capacitor 615a, 615b, respectively, each having capacitance $C_I$. When the switches 612a, 612b are closed during a high phase of corresponding control signal 512, 513, 514 or 515, the output current 516 of the charge pump is integrated on the capacitor $C_I$ and when the switches are opened, at a time $t_n$, the output is held at $V_{TH}(t)=V_{TH}(t_n)$. The switches 612a, 612b are controlled by a clock signal 512 provided by the clock generator 410 (see FIG. 4), and are synchronized with the reference signal 105. After switches 612a, 612b are opened, switches 613a, 613b, controlled by next phase signals 514 or 515, are closed, and the charge stored on the capacitor $C_I$ can be shared with the switched-capacitor circuits in the filter core 520. Thus, the two-integrate and-hold circuits 610a, 610b operate in a "ping-pong" fashion providing non-interrupted integration of the charge pump output current and converting it to charge that can be further shared with the filter core 520.

According to various implementations, the gain of the integrate-and-hold circuits 610a, 610b can be controlled by the width of the ON duration time for switches 612a and 612b or by the duty cycle of the signals 512, 513, 514, 515. In one example, a smaller duration of the ON time of the switches 612a, 612b and 613a, 613b allows for the use of substantially smaller integrating capacitors 615a, 615b than a continuous time integrator. This approach thereby provides a discrete time input for the filter core 520, while also mitigating noise caused by the pulsed nature of the output of the phase detector. The output of the integrate-and-hold circuits 610a, 610b in this example can be passed on directly to the output 516 of the input stage without a buffer-amplifier, such as the buffer-amplifier 620 used in the example of FIG. 6, which eliminates noise contribution from the active circuitry of the amplifier.

According to some implementations, a gain stage is added between the input stage and the filter core to generate correct overall loop filter transfer function. In some examples, the gain stage is a Direct Charge Transfer (DCT) programmable gain amplifier (PGA), where the gain is set by a ratio of sampling and feedback capacitors around an operational amplifier. The output of the amplifier provides the input signal 516 to the filter core 520. The DC ("direct current", zero frequency) gain between phase error and the input to the filter core 520 depends on the magnitude of the charge pump current pulses, and the gain of the amplifier. In general, one or both of the charge pump current pulses and the gain of the amplifier are configurable according to the configuration data for the PLL. The input section 510 introduces an integration of the output of the charge pump current signal, which can be represented as a pole at s=0 in a Laplace Transform representation of the feedback loop transfer function of the PLL.

Figure 3:
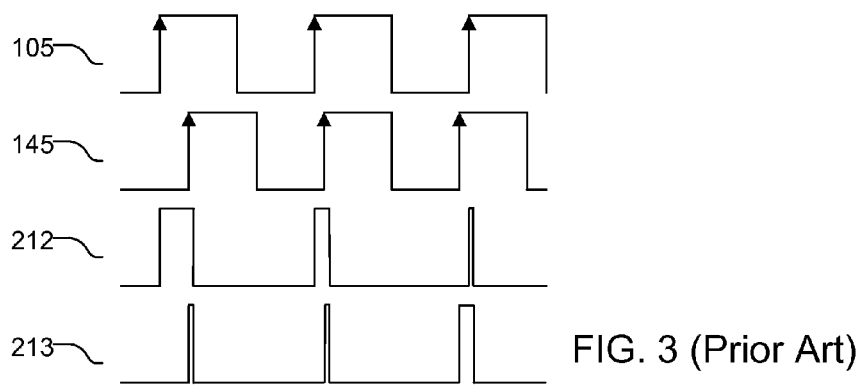
FIG. 3 is a timing diagram illustrating operation of a phase frequency detector.

The input section 510 does not necessarily sample the signal on every cycle of the reference input signal 105, which clocks at a reference frequency $f_{ref}$. For example, the integrate-and-hold circuits 610a, 610b may be clocked at a divisor of the reference clock signal. For example, the clock generator 410 may divide the reference signal by a factor of M=10, and there may the 10 current pulses between samples of the voltage on the capacitor 505. The timing of the sampling by the integrate-and-hold circuits 610a, 610b, nevertheless avoids the current pulses, for example, by synchronizing the sampling times midway between edges of the reference signal associated with the current pulses. For example, as illustrated in FIG. 3, the charge pump pulses are synchronized with the rising edges of the reference signal, and the track-and-hold may be synchronized with every $M^{th}$ falling edge of the reference signal. The factor M by which the reference signal is divided is selected to satisfy an anti-aliasing requirement imposed by the PLL loop 3 db bandwidth and the reference signal frequency $f_{ref}$.

A variety of sampled analog filters can be used for the filter core 520, for example, as described in U.S. Pat. No. 8,717,094, titled "Charge Sharing Time Domain Filter," issued on May 6, 2014, which is incorporated herein by reference. The transfer function may be represented as a Z-transform, for example, as a first order infinite impulse response (IIR) filter $$h(z) = \frac{b_0 + b_1 z^{-1}}{a_0 + a_1 z^{-1}}$$

corresponding to a difference equation $$y[n] = \frac{1}{a_0}(b_0 x[n] + b_1 x[n-1] - a_1 y[n-1])$$

where y[n] is the output of the filter and x[n] is the input. In other implementations, other filter types are used. Some examples of other filter types include $2^{nd}$ or $4^{th}$ order IIR filters, FIR filters, and cascades of multiple filter stages.

Figure 9:
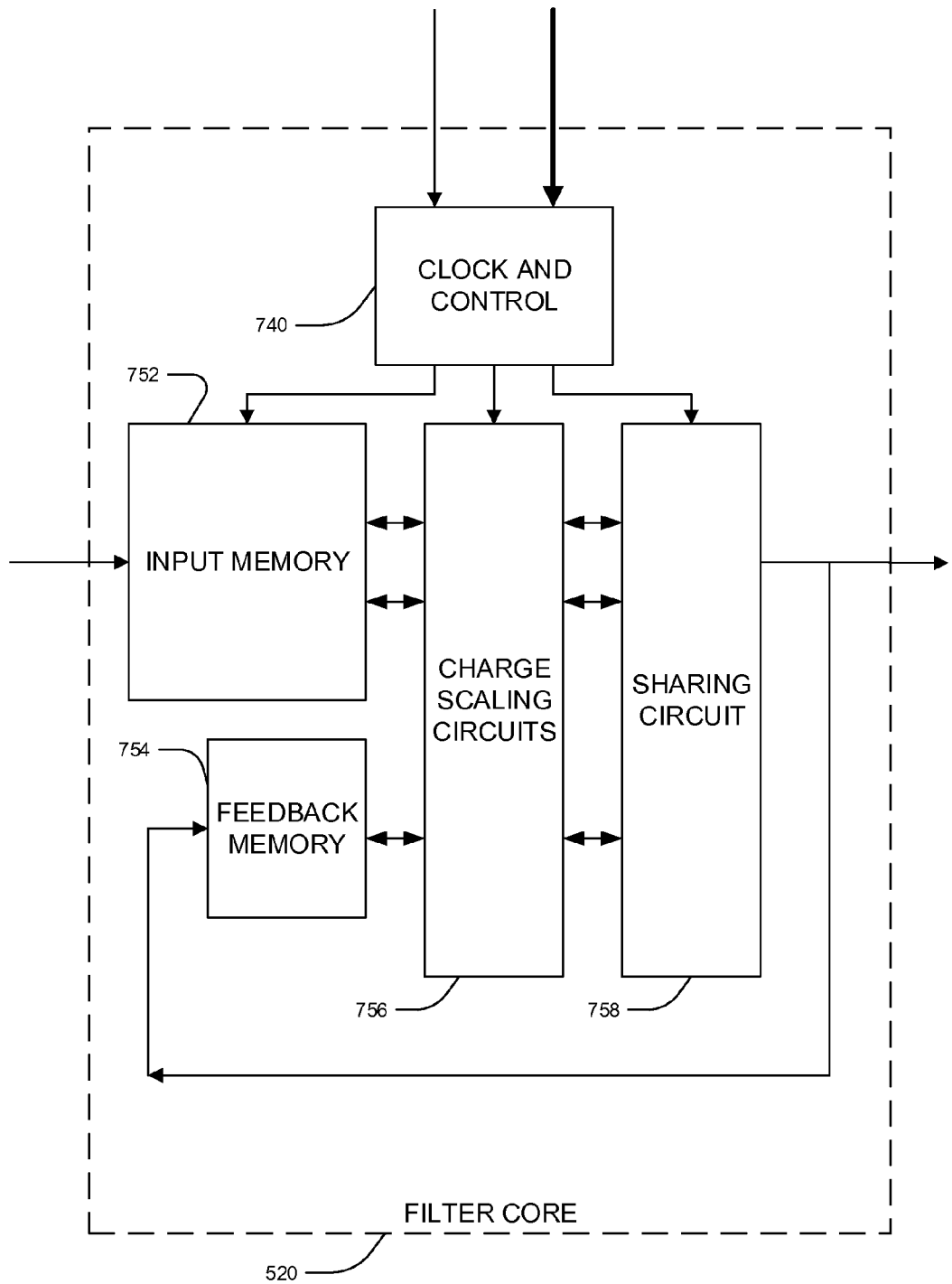
FIG. 9 is a block diagram of a sampled analog filter core of the loop filter, according to some embodiments of the disclosure.

One structure for the filter core 520 is shown in FIG. 9. Generally, a clock and control circuit 740 receives the divided clock signal from the clock generator 410 (see FIG. 5) as well as configuration data. Control signals pass from the controller to the other blocks of the filter. The filter core 520 includes an input analog memory 752, which holds analog values of past input (i.e., the sampled output values of the input section 510) as charges on a set of capacitors, and a feedback memory 754, which holds analog values of past outputs of the filter also as charges on capacitors. The filter coefficients (i.e., the $a_i$ and $b_i$) are implemented using a set of charge scaling circuits 756. Generally, for each sample time, one or more phases of passive charge sharing through configurable switches are used to scale the stored charges to be combined, and the scaled charges are coupled through a sharing circuit 758. The output of the scaling circuit 758 is provided as an output of the filter core 520 and also fed back to the feedback memory 754.

Implementations of the filter core 520 can internally make use of single ended or differential signals, and may present single-ended or differential inputs and outputs. In some implementations, the filter core 520 is implemented as a first order IIR filter core 1000, shown in FIG. 10A. In other implementations, the filter core 520 is implemented as a passive FIR block 1050, shown in FIG. 10B.

Figure 10A:
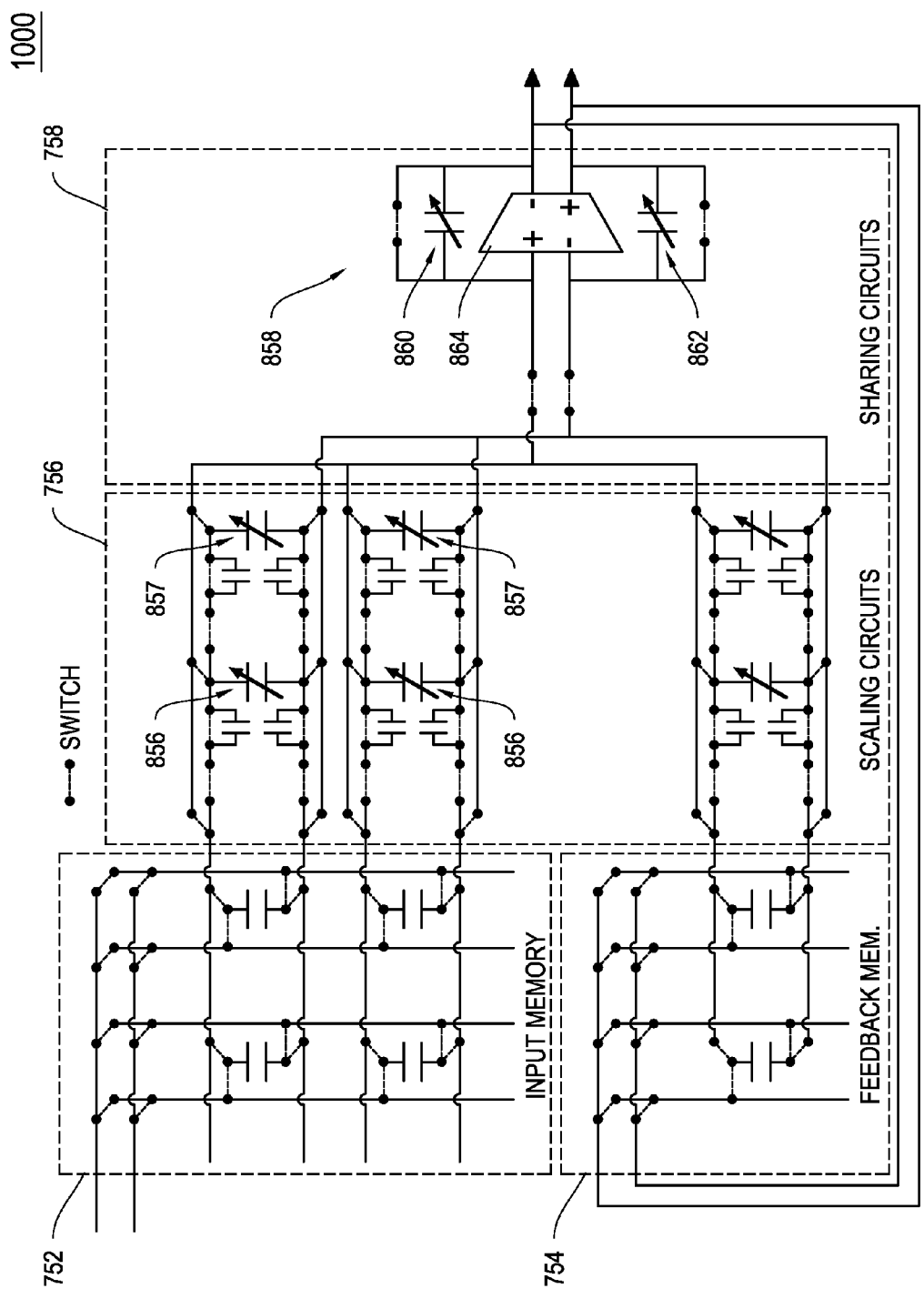
FIG. 10A is a circuit diagram of a sampled analog filter core, according to some embodiments of the disclosure.

FIG. 10A shows a differential signal implementation of a first order IIR filter core 1000. The filter core 1000 is an example of a filter core 520. A corresponding single-ended implementation is similar, and includes connecting one side to a common mode voltage. In one example, the negative input is connected to a common mode voltage. In one example, the common mode voltage for a single supply implementation is vdd/2. In one implementation, operation of the circuit shown in FIG. 10A includes a series of three phases for each sample period, as described in detail below. In this implementation, the input to the filter core 520 is referred to as x[n] and the output of the filter core 520 is referred to as y[n].

Phase 1: The differential inputs charge two of the capacitors of the input memory 752 to a charge proportional to the differential input voltage x[n]. One of the two other capacitors has retained voltage of x[n−1] charged during phase 1 of the previous sampling period. One of the capacitors of the feedback memory 754 has a voltage of y[n−1] from the previous sample period.

Phase 2: A capacitor of the input memory 752 charged to x[n] is coupled to a capacitor 856 of the scaling circuit 756, which has been discharged by switches not shown in the FIG. 9. The capacitor 856 is illustrated as a variable capacitor (e.g., implemented as a switchable bank or other interconnection of fixed capacitors with different configurations of the switches yielding different equivalent capacitances), which is under control of the clock and control circuit 740. In some examples, in a fixed configuration, the capacitor 856 is fixed. With the capacitor 856 having a capacitance of $C_a$, the voltage on the coupled capacitors is $x[n]C_s/(C_s+C_a)=x[n]/(1+C_a/C_s)$. For a desired coefficient of 0.9998, for example, a ratio of $C_a/C_s=2\times10^{-4}$ yields a scaling of the voltage (and charge) on the capacitor in the input memory 752 by the desired coefficient. During this phase, an input memory 752 capacitor holding a voltage of Yes it is analog memory implemented as capacitors.

x[n−1] is similarly scaled, as is a feedback memory 754 capacitor holding a voltage of y[n−1].

Phase 3: The input memory 752 capacitors and/or capacitors 856, 857 of the scaling circuits 756 to which charge has been transferred, which hold the scaled x[n], x[n−1] and y[n−1] voltages, are coupled to the inputs of a differential operational amplifier 858, which transfers the sum of the charges to feedback capacitors 860, 862 (discharged in a previous phase) across the amplifier. The feedback capacitors 860, 862 are shown as variable capacitors (e.g., under the control of the clock and control circuit) but may be fixed, for example, to match (e.g., equal) the input memory 752 capacitors. The output of the differential amplifier 864, which is y[n] is used to charge one of the feedback memory 752 capacitors for use in the next sample period.

In some implementations, the phases can overlap. For example, phase 3 and phase 1 may overlap, with the output charging capacitors in the feedback memory 754 at the same time as the input charging capacitors of the input memory 752. In some examples, the scaling of the charges is performed in two or more phases. In some implementations, other structures for the scaling circuits 756 may be used. For example, in a first phase 2, some of the charge is passed from an input capacitor with capacitance $C_s$ to a first capacitor 856 with capacitance $C_a$ of the scaling circuit 756. In a second phase 2, the first capacitor 856 is decoupled from the capacitor in the input memory 752 and coupled to a second capacitor 857 of the scaling circuit with capacitance $C_b$. In phase 3, both the capacitor in the input memory 752 with capacitance $C_s$ and the second capacitor 857 of the scaling circuit 756 with capacitance $C_b$ are coupled together along with the capacitors for the other coefficients. A coefficient of 0.9998 can be achieved, for example, by choosing $C_a/C_s = C_a/C_b = 1.5 \times 10^{-2}$. According to one feature, a ratio of capacitor sizes less than two orders of magnitude is used to achieve a coefficient of 0.9998 as described above, rather than the four orders of magnitude in the single scaling phase example.

Many other sequences of sharing stages may be used to achieve the desired coefficients. Additionally, the transfer function implemented can be a first order, a second order, or a higher order transfer function. In one example, a second order filter may be used, as described in detail in U.S. Pat. 8,717,094, titled "CHARGE SHARING TIME DOMAIN FILTER". In the case of an $n^{th}$ order filter, in general, the input memory has $(n+1)^2$ capacitors and the feedback memory has $n(n+1)$ capacitors, and there are $2n+1$ scaling circuits.

In the implementation shown in FIG. 10A, the outputs of the filter core 1000 are stable at the end of the third phase, after the charge has been transferred to the capacitors in the feedback paths of the operational amplifier 858, but is not constant during the intervening phases.

Figure 10B:
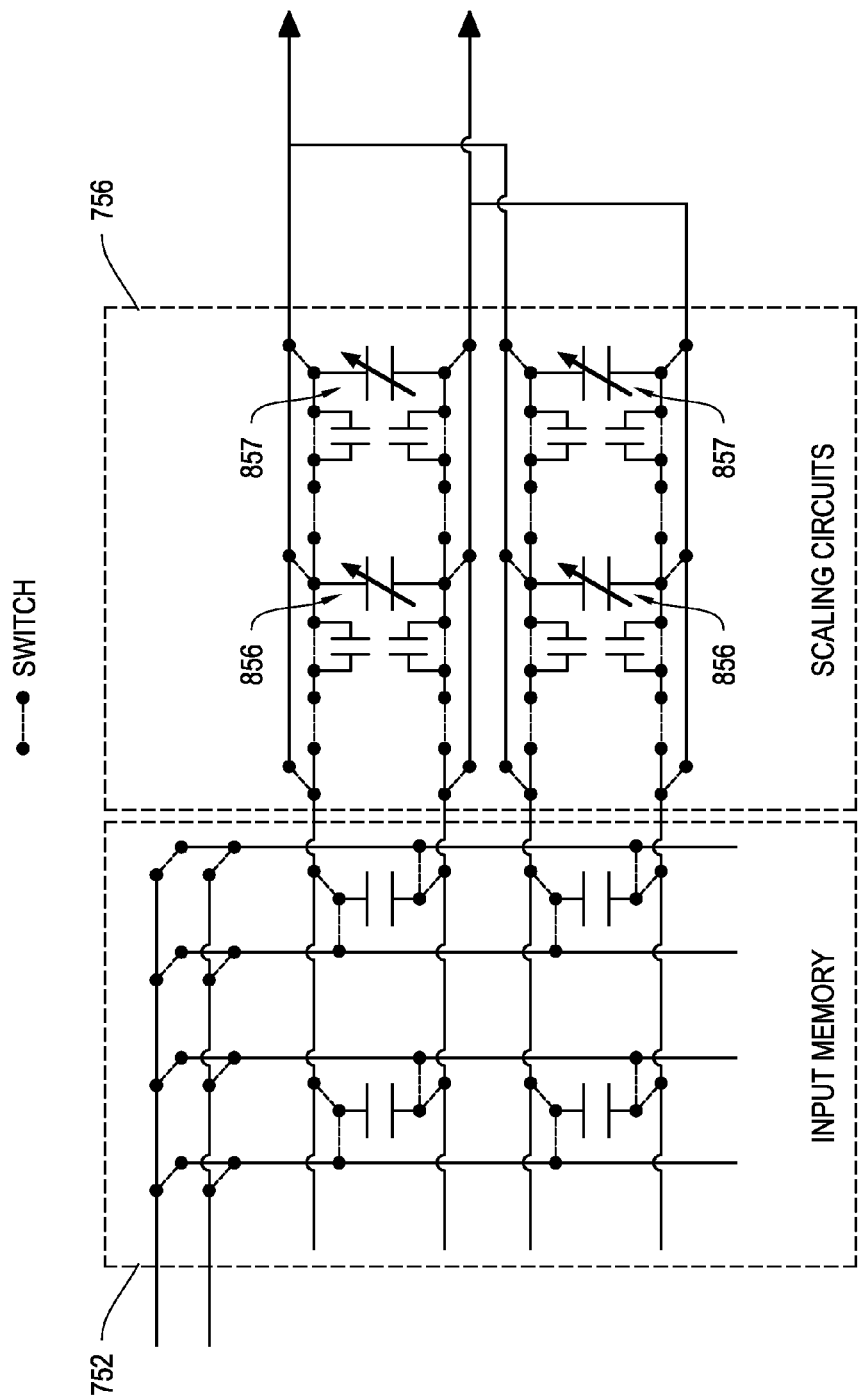
FIG. 10B is a circuit diagram of another sampled analog filter core, according to some embodiments of the disclosure.

FIG. 10B shows a sampled analog filter core 1050, implemented as a passive FIR block. The filter block 1050 includes an input memory 752 and a scaling circuit 756. The scaling circuit 756 includes capacitors 856 and 857, as described above with respect to FIG. 10A.

Figure 11:
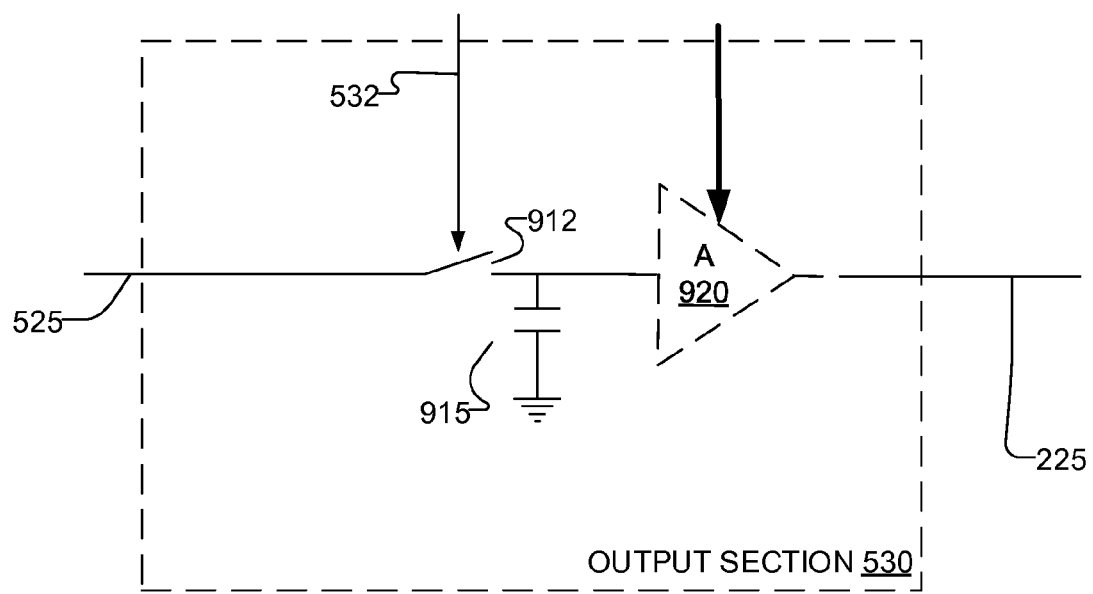
FIG. 11 is a circuit diagram of an output section to a sampled analog IIR loop filter, according to some embodiments of the disclosure.

FIG. 11 is a circuit diagram of an output section to a sampled analog IIR loop filter. As shown in FIG. 11, an implementation of the output section 530 effectively samples the output of the filter core 520 at the end of the third phase described above. In this implementation, a clock signal 532 closes a switch 912 when the output is stable, causing the output voltage to be sampled onto a capacitor 915. Optionally, a fixed or configurable gain amplifier 920 is used to amplify/buffer the output to provide the control signal 225 to the VCO.

In some implementations, the design of the sample analog loop filter is based on an equivalent discrete component analog filter design. Referring to FIG. 12, an example of a discrete component analog filter 420 uses two capacitors 1010, 1015 and a resistor 1020. The Laplace transform for this circuit is $$F(s) = \frac{V_{CTRL}(s)}{I_{CP}(s)} = \frac{1}{s} \frac{sRC_1 + 1}{sRC_1C_2 + (C_1 + C_2)} = \frac{1}{C_2} \frac{1}{s} \frac{s + \omega_z}{s + \omega_p}$$

where the zero is at $\omega_z = 1/(RC_1)$ and the poles are at zero and at $\omega_p = (C_1 + C_2)/(RC_1C_2)$. As discussed above, the input section 510 essentially provides a pole at zero. According to one implementation, if the input section 510 provides a pole at zero, the sampled analog filter essentially needs to provide the equivalent of a Laplace transform $H(s) = (s + \omega_z)/(s + \omega_p)$.

An approximation of a continuous time filter with a Laplace Transform H(s) can be converted to discrete form, for example, using a Bilinear Transform $$s = \frac{2}{T} \frac{(z-1)}{(z+1)}$$

where T is the sampling rate (e.g. $M/f_{ref}$), using other conventional techniques such a matching of impulse responses or pole-zero matching. Using the Bilinear transform, the first order IIR filter has the form:

$$H(z) = \frac{b_0 + b_1 z^{-1}}{a_0 + a_1 z^{-1}} = \frac{\left(\frac{2}{T} + \omega_z\right) - \left(\frac{2}{T} - \omega_z\right) z^{-1}}{\left(\frac{2}{T} + \omega_p\right) - \left(\frac{2}{T} - \omega_p\right) z^{-1}}$$

which can be implemented using the sampled analog filter as described above.

In other implementations, the loop filter, and response time and stability analysis may be performed in the discrete time domain directly as a time sampled loop with a sampling frequency $f_{ref}/M$. In one example, the discrete time domain is a Z Transform domain. As described above, the sampled output of the input section may be considered to introduce a pole at $z=1$ (i.e., an integrator). The VCO is also considered as an integrator, with one sample delay. Therefore, the discrete time loop transfer function (omitting overall gain terms) has the form $$G(z) = \left(\frac{1}{1-z^{-1}}\right) H(z) \left(\frac{z^{-1}}{1-z^{-1}}\right)$$

where the first term is associated with the input section circuit, and the last term is associated with the VCO. The closed loop dynamics of the PLL then follow as $$T(z) = \frac{G(z)}{1 + G(z)}.$$

One feature of a sampled analog loop filter as described above is that the parameters of the filter (i.e., the $a_i$ and the $b_i$) can be set using digital control values. In some examples, these values are chosen in a calibration phase. The values may be chosen in a calibration phase, for example, to account for measured characteristics of open loop or closed loop behavior. Additionally, choosing the values in a calibration phase may help to achieve stability or a desired settling time after a change in frequency of the reference signal. In other examples, an ongoing calibration to match measured characteristics of the loop transfer function or the closed loop response are used to adapt the characteristics of the sampled analog filter. Furthermore, changes in transfer function of the loop filter, gains outside the filter core, and the frequency division (M) that determines the sampling rate of the sampled audio filter, can be easily accomplished by the digital control. In some examples in which the loop filter replaces an discrete component analog filter, for example, being coupled to a Analog Device ADF4350, a "fast lock mode" signal from the ADF4350 is passed to the controller of the filter core, which changes the coefficients of the sampled analog filter. The change in response can be more general, for example changing multiple pole locations in a high order loop filter, or changing the order of the filter. The more general change in response with loop filters contrasts with discrete component filters, which may be controlled using a fast lock mode signal.

As introduced above, in some configurations, a division by a fractional value N+D/M (where D<M) rather than division by an integer N is used in the feedback path from the output of the VCO to the input of the PFD. In general, an approach to implementing such a fractional division is to alternative between division by N and division by N+1 such that a fraction D/M of the time the division is by N+1. The alternation affects "spurs" (i.e., peaks) in the power spectrum of the output of the VCO, and that a selection of the pattern of alternation affects characteristics such as the magnitude of such spurs, phase jitter, etc. Spurs are produced by the additional charge pump current pulses that are inserted by either accumulator/counter based feedback divider or sigma-delta modulator based feedback divider to maintain fractional division ration between reference signal frequency and the VCO output signal frequency. These pulses directly introduce disturbance on the VCO control voltage. Location and magnitude of spurs in frequency domain relative to the VCO output frequency is a strong function of the fractional part of the multiplication ratio. To reduce the effect of the spurs and to attenuate them it is often preferred to having a higher order loop filter that provides sufficient attenuation at large frequency offsets from the VCO output frequency. In some examples, the pattern of alternations between the division factors and the characteristics of the loop filter are designed jointly to select a best (e.g., optimal) combination based on the resulting output characteristics of the VCO. Another approach is to isolate charge pump output from VCO control input and use a sampled analog flop filter with sampling frequencies that are much larger than the loop bandwidth. According to one example, this will effectively push the spurs higher in frequency where they can be more easily attenuated with a relatively small order filter.

Figure 13:
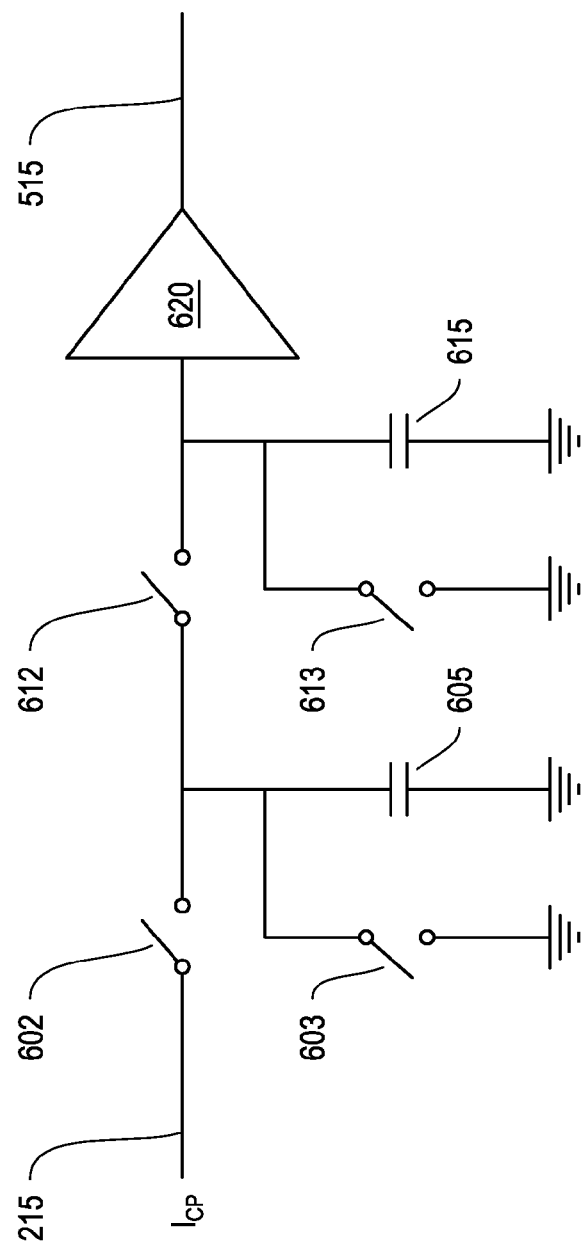
FIG. 13 is a circuit diagram for an alternative input section to a sampled analog loop filter, according to some embodiments of the disclosure.

As introduced above, a number of alternative input sections 510 can be used to couple the output of the charge pump to the filter core 520. For example, referring to FIG. 13, rather than continuously integrating, the capacitor 605 (see FIG. 6) may be isolated by a switch 603 and the capacitors discharged through switches 603 and 613 between sampling periods, thereby removing the effective pole at z=1 introduced by the input section shown in FIG. 6. In yet another alternative, the capacitor 605 of FIG. 13 can be coupled directly to the capacitors of the input memory 752 rather than using the sampling capacitor 615 and the buffer 620. In yet another alternative, the charge pump output directly charges the capacitors of the input memory 752, with the switching between input memory capacitors coupled to the charge pump being performed to avoid the current pulses as in the other embodiments. Also, alternative forms of charge pumps, for example, providing differential current outputs tailored to charge the capacitors of the input memory may be used. Furthermore, alternative forms of phased detector can be used to provide input to the sampled analog loop filter. For example, XOR or other types of detectors may be used. In the case of Type I PLL, when no charge pump is used, and the filter operates on voltage signal, sampled analog loop filter can still be effectively utilized with synthesized loop filter transfer function adjusted accordingly to accommodate voltage mode inputs. Specifically input section 510 maybe omitted altogether and phase detector drives filter core directly.

In some implementations, a computer accessible storage medium includes a database representative of some or all of the PLL 400. Generally speaking, a computer accessible storage medium may include any non-transitory storage media accessible by a computer during use to provide instructions and/or data to the computer. For example, a computer accessible storage medium may include storage media such as magnetic or optical disks and semiconductor memories. Generally, the database representative of the system may be a database or other data structure which can be read by a program and used, directly or indirectly, to fabricate the hardware comprising the system. For example, the database may be a behavioral-level description or register-transfer level (RTL) description of the hardware functionality in a high level design language (HDL) such as Verilog or VHDL. The description may be read by a synthesis tool, which may synthesize the description to produce a netlist comprising a list of gates from a synthesis library. The netlist comprises a set of gates, which also represent the functionality of the hardware comprising the PLL 400. The netlist may then be placed and routed to produce a data set describing geometric shapes to be applied to masks. The masks may then be used in various semiconductor fabrication steps to produce a semiconductor circuit or circuits corresponding to the PLL 400. In other examples, the database may itself be the netlist (with or without the synthesis library) or the data set.

Variations and Implementations

In the discussions of the embodiments above, the capacitors, clocks, DFFs, dividers, inductors, resistors, amplifiers, switches, digital core, transistors, and/or other components can readily be replaced, substituted, or otherwise modified in order to accommodate particular circuitry needs. Moreover, it should be noted that the use of complementary electronic devices, hardware, software, etc. offer an equally viable option for implementing the teachings of the present disclosure.

In one example embodiment, any number of electrical circuits of the FIGURES may be implemented on a board of an associated electronic device. The board can be a general circuit board that can hold various components of the internal electronic system of the electronic device and, further, provide connectors for other peripherals. More specifically, the board can provide the electrical connections by which the other components of the system can communicate electrically. Any suitable processors (inclusive of digital signal processors, microprocessors, supporting chipsets, etc.), computer-readable non-transitory memory elements, etc. can be suitably coupled to the board based on particular configuration needs, processing demands, computer designs, etc. Other components such as external storage, additional sensors, controllers for audio/video display, and peripheral devices may be attached to the board as plug-in cards, via cables, or integrated into the board itself. In various embodiments, the functionalities described herein may be implemented in emulation form as software or firmware running within one or more configurable (e.g., programmable) elements arranged in a structure that supports these functions. The software or firmware providing the emulation may be provided on non-transitory computer-readable storage medium comprising instructions to allow a processor to carry out those functionalities.

In another example embodiment, the electrical circuits of the FIGURES may be implemented as stand-alone modules (e.g., a device with associated components and circuitry configured to perform a specific application or function) or implemented as plug-in modules into application specific hardware of electronic devices. Note that particular embodiments of the present disclosure may be readily included in a system on chip (SOC) package, either in part, or in whole. An SOC represents an IC that integrates components of a computer or other electronic system into a single chip. It may contain digital, analog, mixed-signal, and often radio frequency functions: all of which may be provided on a single chip substrate. Other embodiments may include a multi-chip-module (MCM), with a plurality of separate ICs located within a single electronic package and configured to interact closely with each other through the electronic package. In various other embodiments, the amplification functionalities may be implemented in one or more silicon cores in Application Specific Integrated Circuits (ASICs), Field Programmable Gate Arrays (FPGAs), and other semiconductor chips.

It is also imperative to note that all of the specifications, dimensions, and relationships outlined herein (e.g., the number of processors, logic operations, etc.) have only been offered for purposes of example and teaching only. Such information may be varied considerably without departing from the spirit of the present disclosure, or the scope of the appended claims. The specifications apply only to one non-limiting example and, accordingly, they should be construed as such. In the foregoing description, example embodiments have been described with reference to particular processor and/or component arrangements. Various modifications and changes may be made to such embodiments without departing from the scope of the appended claims. The description and drawings are, accordingly, to be regarded in an illustrative rather than in a restrictive sense.

Note that the activities discussed above with reference to the FIGURES are applicable to any integrated circuits that involve signal processing, particularly those that can execute specialized software programs, or algorithms, some of which may be associated with processing digitized real-time data. Certain embodiments can relate to multi-DSP signal processing, floating point processing, signal/control processing, fixed-function processing, microcontroller applications, etc.

In certain contexts, the features discussed herein can be applicable to medical systems, scientific instrumentation, wireless and wired communications, radar, industrial process control, audio and video equipment, current sensing, instrumentation (which can be highly precise), and other digital-processing-based systems.

Moreover, certain embodiments discussed above can be provisioned in digital signal processing technologies for medical imaging, patient monitoring, medical instrumentation, and home healthcare. This could include pulmonary monitors, accelerometers, heart rate monitors, pacemakers, etc. Other applications can involve automotive technologies for safety systems (e.g., stability control systems, driver assistance systems, braking systems, infotainment and interior applications of any kind) Furthermore, powertrain systems (for example, in hybrid and electric vehicles) can use high-precision data conversion products in battery monitoring, control systems, reporting controls, maintenance activities, etc.

In yet other example scenarios, the teachings of the present disclosure can be applicable in the industrial markets that include process control systems that help drive productivity, energy efficiency, and reliability. In consumer applications, the teachings of the signal processing circuits discussed above can be used for image processing, auto focus, and image stabilization (e.g., for digital still cameras, camcorders, etc.). Other consumer applications can include audio and video processors for home theater systems, DVD recorders, and high-definition televisions. Yet other consumer applications can involve advanced touch screen controllers (e.g., for any type of portable media device). Hence, such technologies could readily part of smartphones, tablets, security systems, PCs, gaming technologies, virtual reality, simulation training, etc.

Note that with the numerous examples provided herein, interaction may be described in terms of two, three, four, or more electrical components. However, this has been done for purposes of clarity and example only. It should be appreciated that the system can be consolidated in any suitable manner. Along similar design alternatives, any of the illustrated components, modules, and elements of the FIGURES may be combined in various possible configurations, all of which are clearly within the broad scope of this Specification. In certain cases, it may be easier to describe one or more of the functionalities of a given set of flows by only referencing a limited number of electrical elements. It should be appreciated that the electrical circuits of the FIGURES and its teachings are readily scalable and can accommodate a large number of components, as well as more complicated/sophisticated arrangements and configurations. Accordingly, the examples provided should not limit the scope or inhibit the broad teachings of the electrical circuits as potentially applied to a myriad of other architectures.

Note that in this Specification, references to various features (e.g., elements, structures, modules, components, steps, operations, characteristics, etc.) included in "one embodiment", "example embodiment", "an embodiment", "another embodiment", "some embodiments", "various embodiments", "other embodiments", "alternative embodiment", and the like are intended to mean that any such features are included in one or more embodiments of the present disclosure, but may or may not necessarily be combined in the same embodiments.

Numerous other changes, substitutions, variations, alterations, and modifications may be ascertained to one skilled in the art and it is intended that the present disclosure encompass all such changes, substitutions, variations, alterations, and modifications as falling within the scope of the appended claims. In order to assist the United States Patent and Trademark Office (USPTO) and, additionally, any readers of any patent issued on this application in interpreting the claims appended hereto, Applicant wishes to note that the Applicant: (a) does not intend any of the appended claims to invoke paragraph six (6) of 35 U.S.C. section 112 as it exists on the date of the filing hereof unless the words "means for" or "step for" are specifically used in the particular claims; and (b) does not intend, by any statement in the specification, to limit this disclosure in any way that is not otherwise reflected in the appended claims.

OTHER NOTES, EXAMPLES, AND IMPLEMENTATIONS

Note that all optional features of the apparatus described above may also be implemented with respect to the method or process described herein and specifics in the examples may be used anywhere in one or more embodiments.

In a first example, a system is provided (that can include any suitable circuitry, dividers, capacitors, resistors, inductors, ADCs, DFFs, logic gates, software, hardware, links, etc.) that can be part of any type of computer, which can further include a circuit board coupled to a plurality of electronic components. The system can include means for clocking data from the digital core onto a first data output of a macro using a first clock, the first clock being a macro clock; means for clocking the data from the first data output of the macro into the physical interface using a second clock, the second clock being a physical interface clock; means for clocking a first reset signal from the digital core onto a reset output of the macro using the macro clock, the first reset signal output used as a second reset signal; means for sampling the second reset signal using a third clock, which provides a clock rate greater than the rate of the second clock, to generate a sampled reset signal; and means for resetting the second clock to a predetermined state in the physical interface in response to a transition of the sampled reset signal.

The 'means for' in these instances (above) can include (but is not limited to) using any suitable component discussed herein, along with any suitable software, circuitry, hub, computer code, logic, algorithms, hardware, controller, interface, link, bus, communication pathway, etc. In a second example, the system includes memory that further comprises machine-readable instructions that when executed cause the system to perform any of the activities discussed above.

What is claimed is:

1. An integrated circuit implementing at least part of a phase locked loop (PLL), the integrated circuit comprising:
    a configurable sampled analog loop filter for the PLL, the sampled analog loop filter including:
       a first input for receiving a signal representative of a phase difference between a reference clock signal and a first clock signal,
       a first output for providing a frequency control signal for controlling a frequency of an oscillator,
       a clock input for accepting a loop timing clock signal for controlling timing of operation of the sampled analog loop filter, and
       a digital control input for configuring a response of the sampled analog loop filter according to a plurality of control values.

2. The integrated circuit of claim 1, wherein the sampled analog loop filter is configurable to provide an infinite impulse response.

3. The integrated circuit of claim 2, wherein the sampled analog loop filter is configurable to determine at least one zero and one pole of a frequency response of the filter.

4. The integrated circuit of claim 1, wherein the sampled analog loop filter is configurable to provide a finite impulse response.

5. The integrated circuit of claim 1, wherein a signal path between the first input and the first output of the sampled analog loop filter comprises at most one active gain element.

6. The integrated circuit of claim 1 further comprising:
    an input for receiving the reference clock signal; and
    comparison circuitry including a first input for receiving the reference clock signal and a second input for receiving the first clock signal and an output for providing a signal representative of phase difference between the reference clock signal and the first clock signal.

7. The integrated circuit of claim 1 further comprising:
    a clock divider including an input for receiving a second clock signal and an output for providing the first clock signal formed such that the second clock signal has a frequency that is a multiple of the first clock signal.

8. The integrated circuit of claim 7 further comprising:
    a controlled oscillator having an input for receiving the frequency control signal from the sampled analog loop filter and an output for providing the second clock signal.

9. The integrated circuit of claim 1 further comprising:
    timing control circuitry including an input for receiving the reference clock signal and an output for providing the loop timing clock signal synchronized to the reference clock signal.

10. The integrated circuit of claim 1, wherein the loop timing clock signal is different from the reference clock signal, and wherein the sampled analog loop filter includes an integrate and hold module for sampling the first input using the loop timing clock signal.

11. The integrated circuit of claim 1, wherein the sampled analog loop filter comprises:
    a direct charge transfer programmable gain amplifier to provide an amplified sampled first input to the IIR filter.

12. The integrated circuit of claim 1, further comprising:
    data storage circuitry coupled to the sampled analog loop filter for holding control values for the sampled analog loop filter for at least configuration of two selectable responses of the sampled analog loop filter.

13. The integrated circuit of claim 12, further comprising an input for selecting a configuration of the sampled analog loop filter.

14. A method for implementing at least part of a phase locked loop (PLL), comprising:
    receiving, by a configurable sampled analog loop filter in an integrated circuit of the PLL, a phase difference signal representative of a phase difference between a reference clock signal and a feedback clock signal in the PLL;
    receiving, by the sampled analog loop filter, a digital control input for configuring a response of the sampled analog loop filter according to a plurality of control values;
    controlling, by the sampled analog loop filter a timing operation using a loop timing clock signal received by the sampled analog loop filter; and
    providing, by the sampled analog loop filter, a frequency control signal for controlling a frequency of an oscillator using the received phase difference signal, the digital control input and the loop timing clock signal.

15. The method of claim 14, further comprising generating the loop timing control signal using the reference clock signal such that operation of the sampled analog loop filter is synchronized with the reference clock signal.

16. The method of claim 15, wherein generating the loop timing control signal comprises forming the loop timing control signal using a frequency division of the reference clock signal.

17. The method of claim 14, further comprising operating the sampled analog loop filter in at least two operating modes, including receiving digital control inputs for configuring corresponding responses in each of the two modes, the responses differing in bandwidth.

18. An integrated circuit implementing at least part of a phase locked loop (PLL), the integrated circuit comprising:
    a plurality of sampled analog filters for the PLL, each sampled analog filter having:
       a first input for receiving a signal representative of a phase difference between a reference clock signal and a first clock signal,
       a first output for providing a frequency control signal for controlling a frequency of an oscillator, and a clock input for accepting a loop timing clock signal for controlling timing of operation of the sampled analog filter, wherein each of the plurality of sampled analog filters are positioned in parallel in an input path for the first input.

19. The integrated circuit of claim 18, wherein each of the plurality of sampled analog filters are fixed-coefficient time-sampled analog filters.

20. The integrated circuit of claim 19, wherein the plurality of sampled analog filters includes a first filter having a small loop bandwidth and a second filter having a large loop bandwidth.

21. The integrated circuit of claim 18, wherein each sampled analog filter further includes a digital control input, and the digital control input configures a response of the respective sampled analog filter according to a plurality of control values.

22. The integrated circuit of claim 18, further comprising a digital control input for selecting one of the plurality of sampled analog filters for providing the first output to the oscillator.

23. The integrated circuit of claim 18, wherein the digital control input switches between ones of the plurality of sampled analog filters.

24. The integrated circuit of claim 1, wherein the sampled analog loop filter comprises a plurality of charge storage elements coupled by controllable switches, wherein the sampled analog loop filter comprises control circuitry for transferring charge among the charge storage elements to yield a configured response of the sampled analog loop filter.

25. The integrated circuit of claim 24, wherein the control circuitry for transferring charge among the charge storage elements transfers charge according to sequential configurations of the controllable switches, the sequential configurations being determined by the plurality of control values to yield the configured response of the sampled analog loop filter.

26. The method of claim 14, wherein the sampled analog loop filter comprises a plurality of charge storage elements coupled by controllable switches, wherein the sampled analog loop filter comprises control circuitry for transferring charge among the charge storage elements to yield a configured response of the sampled analog loop filter.

27. The integrated circuit of claim 18, wherein the plurality of sampled analog filters comprise a plurality of charge storage elements coupled by controllable switches, wherein the plurality of sampled analog filters comprises control circuitry for transferring charge among the charge storage elements to yield a configured response of the plurality of sampled analog filters.

* * * * *